(12) United States Patent
Kawamura

(10) Patent No.: US 12,400,844 B2
(45) Date of Patent: Aug. 26, 2025

(54) PLASMA PROCESSING APPARATUS AND METHOD OF MEASURING TEMPERATURE OF MEMBERS

(71) Applicant: TOKYO ELECTRON LIMITED, Tokyo (JP)

(72) Inventor: Koji Kawamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1203 days.

(21) Appl. No.: 17/177,900

(22) Filed: Feb. 17, 2021

(65) Prior Publication Data

US 2021/0265145 A1 Aug. 26, 2021

(30) Foreign Application Priority Data

Feb. 21, 2020 (JP) .................... 2020-028222

(51) Int. Cl.
*H01J 37/32* (2006.01)
*H01L 21/67* (2006.01)

(52) U.S. Cl.
CPC .. *H01J 37/32935* (2013.01); *H01J 37/32082* (2013.01); *H01L 21/67069* (2013.01); *H01L 21/67248* (2013.01); *H01J 2237/24585* (2013.01); *H01J 2237/334* (2013.01)

(58) Field of Classification Search
USPC ......................................... 118/715
See application file for complete search history.

(56) References Cited

U.S. PATENT DOCUMENTS

2011/0279052 A1* 11/2011 Beasley ............... B60Q 11/005
    315/246
2017/0084432 A1*  3/2017 Valcore, Jr. ....... H01J 37/32146

FOREIGN PATENT DOCUMENTS

| JP | H1131599 A | 2/1999 |
| JP | 2000138208 A | 5/2000 |
| JP | 2000-167385 A | 6/2000 |
| JP | 2010-166006 A | 7/2010 |
| JP | 2010-251723 A | 11/2010 |

* cited by examiner

*Primary Examiner* — Ram N Kackar
(74) *Attorney, Agent, or Firm* — Nath, Goldberg & Meyer; Jerald L. Meyer; Tanya E. Harkins

(57) ABSTRACT

A plasma processing apparatus having a processing container and an electrode includes: a preprocessing part configured to perform a preprocessing of igniting plasma to increase a temperature of members within the processing container; a power application part configured to apply a radio frequency (RF) power to the electrode without igniting plasma after the preprocessing is performed; a measuring part configured to measure a physical quantity related to the RF power applied by the power application part; and a determination part configured to determine whether or not the temperature of the members within the processing container is saturated based on the physical quantity related to the RF power measured by the measuring part.

8 Claims, 7 Drawing Sheets

PLASMA PROCESSING APPARATUS AND METHOD OF MEASURING TEMPERATURE OF MEMBERS

CROSS-REFERENCE TO RELATED APPLICATION

This application is based upon and claims the benefit of priority from Japanese Patent Application No. 2020-028222, filed on Feb. 21, 2020, the entire contents of which are incorporated herein by reference.

TECHNICAL FIELD

The present disclosure relates to a plasma processing apparatus and a method of measuring a temperature of members.

BACKGROUND

Conventionally, a plasma processing apparatus that performs a plasma process on a workpiece such as a wafer by using plasma has been known. Such a plasma processing apparatus includes a stage configured to hold a workpiece thereon and serve as an electrode within a processing container capable of forming, for example, a vacuum space therein. The plasma processing apparatus carries out the plasma process on the workpiece placed on the stage by applying a predetermined high-frequency power (RF power) to the stage. In addition, the plasma processing apparatus performs a preprocessing for igniting the plasma to increase a temperature of members within the processing container before performing the plasma process on the workpiece. Such a preprocessing is also called a seasoning process. The seasoning process is implemented by igniting the plasma in a state in which a dummy wafer is placed on the stage. The seasoning process is repeatedly performed a predetermined number of times, for example, until the temperature of the members in the processing container is saturated.

PRIOR ART DOCUMENT

Patent Document

Patent Document 1: Japanese laid-open publication No. 2000-167385

SUMMARY

According to an aspect of the present disclosure, a plasma processing apparatus is an apparatus having a processing container and an electrode. The plasma processing apparatus includes: a preprocessing part configured to perform a preprocessing of igniting plasma to increase a temperature of members within the processing container; a power application part configured to apply a radio frequency (RF) power to the electrode without igniting plasma after the preprocessing is performed; a measuring part configured to measure a physical quantity related to the RF power applied by the power application part; and a determination part configured to determine whether or not the temperature of the members within the processing container is saturated based on the physical quantity related to the RF power measured by the measuring part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a plasma processing apparatus, it may be determined whether or not a temperature of members in a processing container is saturated based on a measurement result by using a thermometer provided within the processing container, and when the temperature of the members within the processing container is saturated, repetition of a seasoning process may be terminated. However, if the thermometer is provided in the processing container, the location of the thermometer becomes a singular point of temperature, which reduces accuracy of the measurement result by the thermometer. As a result, it becomes difficult to determine whether or not the temperature of the members within the processing container is saturated with high precision. In addition, uniformity in temperature of the members within the processing container is adversely affected.

Therefore, it is desired to determine saturation of the temperature of the members within the processing container with high precision without providing a thermometer in the processing container

[Configuration of Plasma Processing Apparatus]

Figure 1:
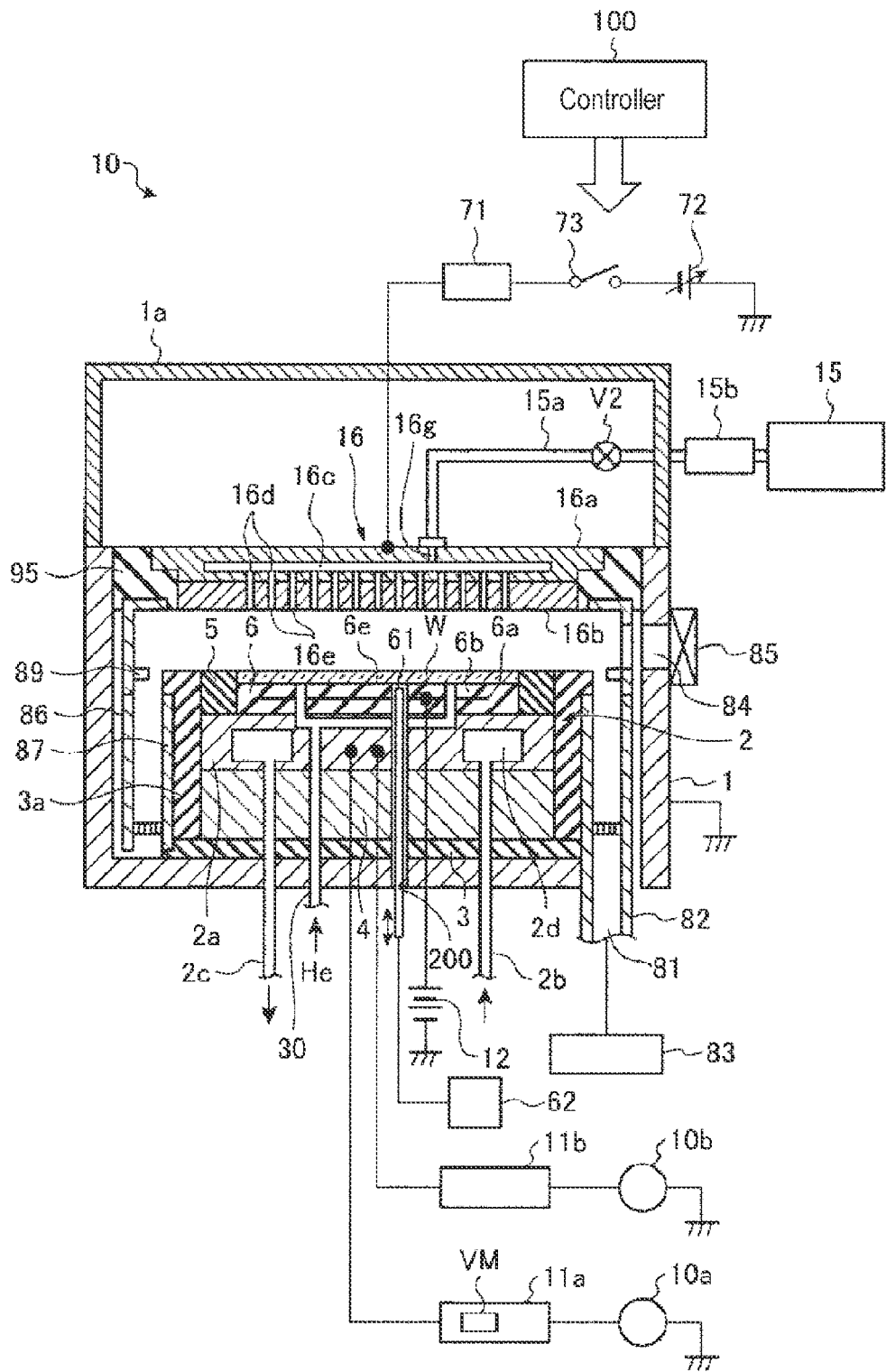
FIG. 1 is a schematic cross-sectional view illustrating a configuration of a plasma processing apparatus according to an embodiment.

FIG. 1 is a schematic cross-sectional view illustrating a configuration of a plasma processing apparatus 10 according to an embodiment. The plasma processing apparatus 10 includes a processing container 1, which is hermetically configured with an electrically ground potential. The processing container 1 has a cylindrical shape and is formed of, for example, aluminum. The processing container 1 defines a processing space in which plasma is generated. A stage 2 configured to horizontally support a semiconductor wafer (hereinafter, simply referred to as a "wafer") W as a workpiece thereon is provided in the processing container 1. The stage 2 includes a base 2a and an electrostatic chuck (ESC) 6. The base 2a is formed of a conductive metal such as aluminum, and functions as a lower electrode. The electrostatic chuck 6 functions to electrostatically adsorb the wafer W. The stage 2 is supported on a support table 4. The support table 4 is supported by a support 3 formed of, for example, quartz. In addition, a focus ring 5 formed of, for example, monocrystalline silicon, is provided on an upper outer periphery of the stage 2. In addition, a cylindrical inner wall 3a formed of, for example, quartz, is provided in the processing container 1 so as to surround a periphery of the stage 2 and the support table 4.

A first RF power supply 10a is connected to the base 2a via a first matcher 11a, and a second RF power supply 10b is connected to the base 2a via a second matcher 11b. The first RF power supply 10a is a power supply mainly for plasma generation, and is configured to supply a high-frequency power of a predetermined frequency selected in a range of 10 MHz to 150 MHz to the base 2a of the stage 2. The second RF power supply 10b is a power supply mainly for ion attraction (for biasing), and is configured to supply a high-frequency power of a predetermined frequency selected in a range of 100 KHz to 40 MHz, which is lower than that of the first RF power supply 10a, to the base 2a of the stage 2. As described above, the stage 2 is configured such that voltages can be applied to the stage 2.

The frequency of the first RF power supply 10a also acts considerably on ion attraction at the same time as plasma generation, and a ratio of ion attraction action increases as the frequency decreases. The frequency of the second RF power supply 10b also acts considerably on plasma generation at the same time as ion attraction, and a ratio of plasma generation action increases as the frequency increases.

In addition, the first matcher 11a is provided with a measuring device VM. The measuring device VM measures a voltage Vpp (voltage peak to peak), which is an RF voltage of the RF power output from the first RF power supply 10a and applied to the stage 2 via the first matcher 11a. The voltage Vpp is an example of a physical quantity related to the RF power applied to the stage 2. The measuring device VM notifies a controller 100 of RF voltage data indicating the measured voltage Vpp.

In addition, above the stage 2, a shower head 16 functioning as an upper electrode is provided to face the stage 2 in parallel with respect to the stage 2. The shower head 16 and the stage 2 function as a pair of electrodes (the upper electrode and the lower electrode).

The electrostatic chuck 6 is configured by embedding an electrode 6a in an insulator 6b, and a DC power supply 12 is connected to the electrode 6a. In addition, the electrostatic chuck 6 is configured to attract the wafer W by using Coulomb force when a DC voltage is applied to the electrode 6a from the DC power supply 12.

A coolant flow path 2d is formed inside the stage 2, and a coolant inlet pipe 2b and a coolant outlet pipe 2c are connected to the coolant flow path 2d. The stage 2 is configured to be controllable to a predetermined temperature by circulating an appropriate coolant, such as cooling water, in the coolant flow path 2d. In addition, a gas supply pipe 30 is provided to penetrate the stage 2 so as to supply a cold heat transfer gas (a backside gas), such as helium gas, to the rear surface of the wafer W, and the gas supply pipe 30 is connected to a gas source (not illustrated). With this configuration, the temperature of the wafer W attracted and held by the electrostatic chuck 6 on the top surface of the stage 2 is controlled to a predetermined temperature.

The temperature of the focus ring 5 provided on the upper outer periphery of the stage 2 is also controlled to a predetermined temperature. The temperatures of the wafer W and the focus ring 5 may be controlled to a predetermined temperature by providing a heater inside the stage 2 or the electrostatic chuck 6 and heating the heater to a predetermined temperature.

The stage 2 is provided with a plurality of (e.g., three) pin penetration holes 200 (only one of which is illustrated in FIG. 1), and a lifter pin 61 is provided inside each of the pin penetration holes 200. The lifter pin 61 is connected to a driving mechanism 62 so as to be moved upward and downward by the driving mechanism 62.

The shower head 16 is provided on a ceiling wall portion of the processing container 1. The shower head 16 includes a main body 16a and an upper ceiling plate 16b serving as an electrode plate, and is supported at the upper portion of the processing container 1 via an insulator 95. The main body 16a is formed of a conductive material, such as aluminum having an anodized surface, and is configured to be capable of detachably supporting the upper ceiling plate 16b therebelow.

A gas diffusion chamber 16c is provided inside the main body 16a. A plurality of gas flow holes 16d is formed at a bottom portion of the main body 16a so as to be located below the gas diffusion chamber 16c. The upper ceiling plate 16b includes gas introduction holes 16e penetrating the upper ceiling plate 16b in the thickness direction thereof. The gas introduction holes 16e are provided to overlap the gas flow holes 16d described above. With this configuration, a processing gas supplied to the gas diffusion chamber 16c is dispersed and supplied into the processing container 1 in the form of a shower via the gas flow holes 16d and the gas introduction holes 16e.

A gas inlet 16g for introducing the processing gas into the gas diffusion chamber 16c is formed in the main body 16a. One end of a gas supply pipe 15a is connected to the gas inlet 16g. A processing gas source (a gas supply part) 15 for supplying the processing gas is connected to the other end of the gas supply pipe 15a. The gas supply pipe 15a is provided with a mass flow controller (MFC) 15b and an opening and closing valve V2 in this order from the upstream side. The processing gas for plasma etching is supplied from the gas source 15 to the gas diffusion chamber 16c via the gas supply pipe 15a. The processing gas is dispersed and supplied into the processing container 1 in the form of a shower from the gas diffusion chamber 16c via the gas flow holes 16d and the gas introduction holes 16e.

A variable DC power supply 72 is electrically connected to the shower head 16 serving as the upper electrode via a low-pass filter (LPF) 71. The variable DC power supply 72 is configured to be capable of allowing and stopping a supply of power via an on and off switch 73. The current and voltage of the variable DC power supply 72 and the turning-on and turning-off of the on and off switch 73 are controlled by the controller 100 to be described later. As will be described later, when the high-frequency powers are applied to the stage 2 from the first RF power supply 10a and the second RF power supply 10b and plasma is generated in the processing space, the on and off switch 73 is turned on by the controller 100 as necessary to apply a predetermined DC voltage to the shower head 16 as the upper electrode.

A cylindrical ground conductor 1a is provided so as to extend from the side wall of the processing container 1 to a location above the height position of the shower head 16. The cylindrical ground conductor 1a has a ceiling wall in the upper portion thereof.

An exhaust port 81 is formed in the bottom portion of the processing container 1. A first exhaust device 83 is connected to the exhaust port 81 via an exhaust pipe 82. The first exhaust device 83 has a vacuum pump, and is configured to operate the vacuum pump so as to reduce a pressure inside the processing container 1 to a predetermined degree of vacuum. In addition, a loading and unloading port 84 for the wafer W is provided in the side wall of the processing container 1, and the loading and unloading port 84 is provided with a gate valve 85 configured to open and close the loading and unloading port 84.

Inside the side portion of the processing container 1, a deposit shield 86 is provided along the inner wall surface of the processing container 1. The deposit shield 86 prevents an etching byproduct (deposits) from adhering to the processing container 1. At substantially the same height position as the wafer W, a conductive member (a GND block) 89, which is connected such that the potential thereof with respect to the ground is controllable, is provided to prevent abnormal discharge from occurring. In addition, in the vicinity of a lower end portion of the deposit shield 86, a deposit shield 87 is provided to extend along the inner wall 3a. The deposit shields 86 and 87 are detachably installed.

The operation of the plasma processing apparatus 10 having the configuration described above is generally controlled by the controller 100. The controller 100 is, for example, a computer, and controls the respective components of the plasma processing apparatus 10.

[Configuration of Controller]

Figure 2:
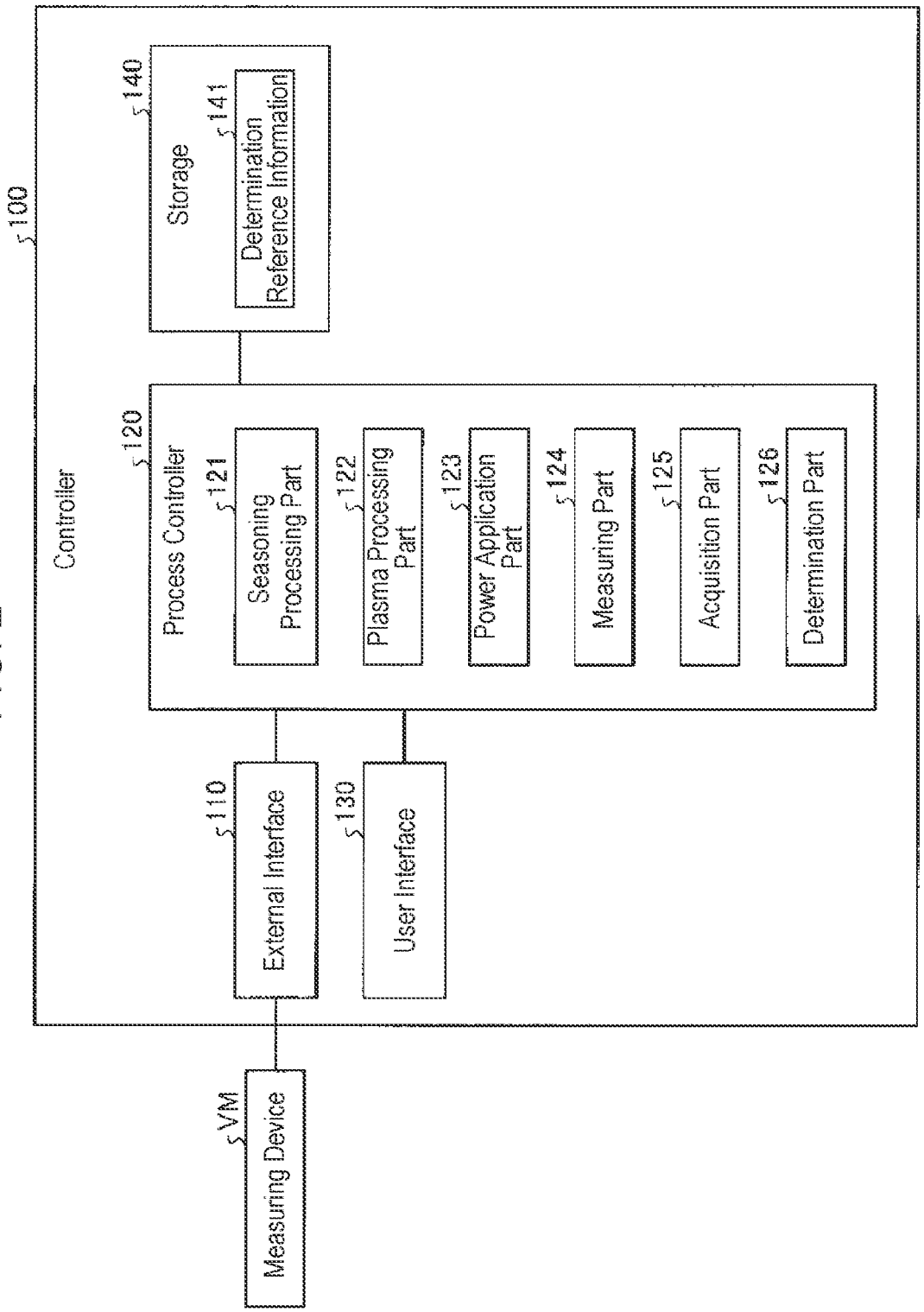
FIG. 2 is a block diagram illustrating a schematic configuration of a controller configured to control a plasma processing apparatus according to an embodiment.

Next, the controller 100 will be described in detail. FIG. 2 is a block diagram schematically illustrating a configuration of the controller 100, which controls the plasma processing apparatus 10 according to an embodiment. The controller 100 is, for example, a computer, and includes an external interface 110, a process controller 120, a user interface 130, and a storage 140.

The external interface 110 is configured to be capable of communicating with the respective components of the plasma processing apparatus 10, and inputs and outputs various kinds of data. For example, RF voltage data indicating the voltage Vpp of the RF power applied to the stage 2 is input to the external interface 110 from the measuring device VM.

The process controller 120 includes a central processing unit (CPU) so as to control the respective components of the plasma processing apparatus 10.

The user interface 130 includes, for example, a keyboard configured to allow a process manager to input commands for managing the plasma processing apparatus 10, and a display configured to visualize and display an operation status of the plasma processing apparatus 10.

The storage 140 stores a control program (software) for implementing various processes carried out in the plasma processing apparatus 10 under a control of the process controller 120 or a recipe in which processing condition data or the like is stored. The storage 140 stores, for example, determination reference information 141. The determination reference information 141 is data that serves as a reference for determining whether or not a temperature of members within the processing container 1 is saturated when a seasoning process to be described later is performed, and is data indicating the voltage Vpp measured in advance in a state in which the temperature of the members in the processing container 1 is saturated. Details of the determination reference information 141 will be described later. The control program or the processing condition data may be stored in a non-transitory computer storage medium (e.g., an optical disk such as a hard disk or a DVD, a flexible disk, or a semiconductor memory) that is capable of being read by a computer. In addition, the control program, the recipe, or parameters may be stored in another device, and may be read and used online, for example, via a dedicated line.

The process controller 120 includes an internal memory that stores a program or data, and reads the control program stored in the storage 140 to execute processing of the read control program. The process controller 120 functions as various processing parts by executing the control program. For example, the process controller 120 functions as a seasoning processing part 121, a plasma processing part 122, a power application part 123, a measuring part 124, an acquisition part 125, and a determination part 126. In the present embodiment, the case where the process controller 120 functions as various processing parts will be described by way of example, but the present disclosure is not limited thereto. For example, the functions of the seasoning processing part 121, the plasma processing part 122, the power application part 123, the measuring part 124, the acquisition part 125, and the determination part 126 may be distributed to and implemented by a plurality of controllers.

The plasma processing apparatus 10 performs a preprocessing of igniting plasma to increase a temperature of members in the processing container 1 before performing a plasma process on the wafer W. Such a preprocessing is also called a seasoning process. The seasoning process is implemented by, for example, igniting plasma in a state in which a dummy wafer is placed on the stage 2. The seasoning process is repeated, for example, a predetermined number of times until the temperature of the members within the processing container 1 is saturated. However, when the repetition number of the seasoning process is excessive, the timing for starting a plasma process on the wafer W is delayed, and thus an operation rate (throughput) of the plasma processing apparatus 10 decreases.

For this reason, in the plasma processing apparatus 10, it may be considered to determine whether or not a temperature of members in the processing container 1 is saturated based on a measurement result by using a thermometer provided within the processing container 1, and to terminate repetition of the seasoning process when the temperature of the members within the processing container 1 is saturated. However, when the thermometer is provided in the processing container 1, the location of the thermometer becomes a singular point of temperature, and thus the accuracy of the measurement result by the thermometer is reduced. As a result, it becomes difficult to determine whether or not the temperature of the members within the processing container 1 is saturated with high precision. In addition, the uniformity in temperature of the members within the processing container 1 is adversely affected.

Therefore, in the plasma processing apparatus 10 according to the present embodiment, saturation of a temperature of members within the processing container 1 is determined without providing a thermometer in the processing container 1. Specifically, the plasma processing apparatus 10 determines whether or not a temperature of members within the processing container 1 is saturated by using the voltage Vpp of the RF power applied to the stage 2.

Here, with reference to FIGS. 3 and 4, a relationship between the voltage Vpp of the RF power applied to the stage 2 and a temperature of members within the processing container 1 will be described.

Figure 3:
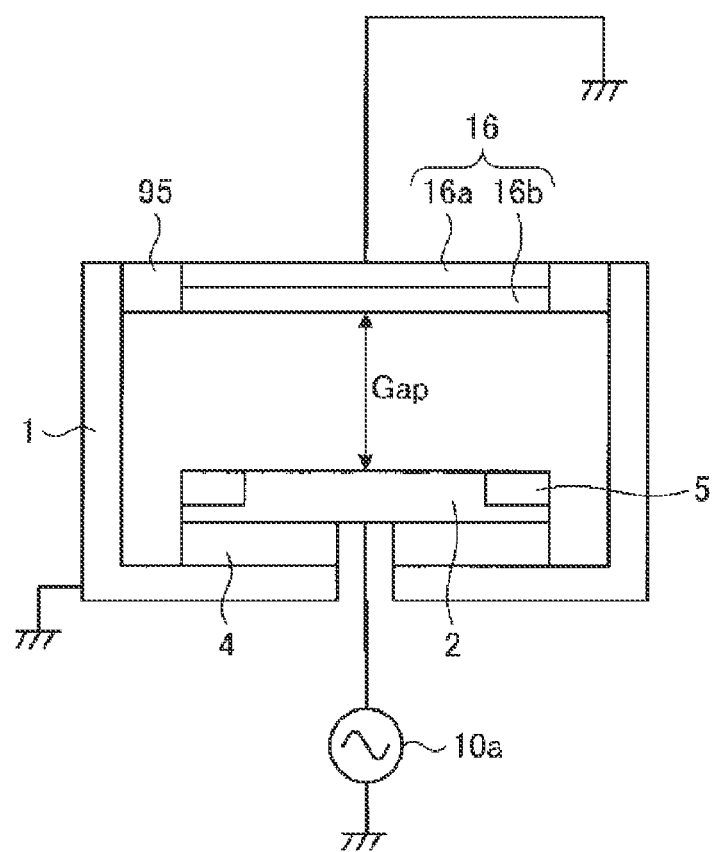
FIG. 3 is a view schematically illustrating members within a processing container.

FIG. 3 is a view schematically illustrating members within the processing container 1. A processing space in which plasma is generated is formed in the processing container 1. The processing space faces, for example, an inner wall surface of the processing container 1, the stage 2 as a lower electrode, the support table 4, the focus ring 5, the shower head 16 as an upper electrode, and the insulator 95. When plasma is generated, for example, an RF power having a predetermined frequency is applied to the stage 2 from the first RF power supply 10a.

Figure 4:
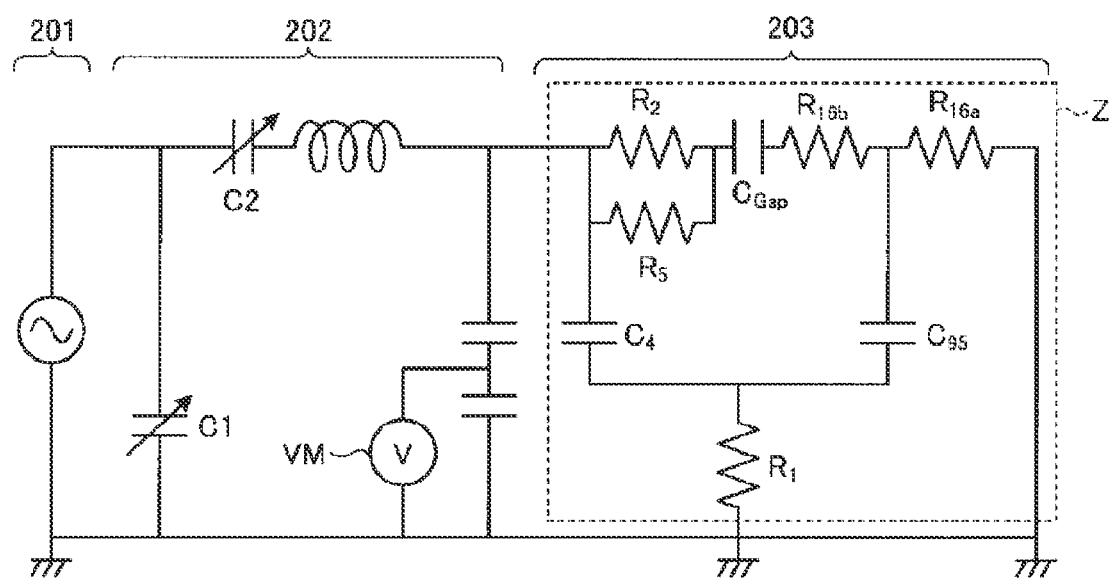
FIG. 4 is a view illustrating an equivalent circuit of an exemplary electrical state of a plasma processing apparatus when an RF power is applied to a stage.

FIG. 4 is a view illustrating an equivalent circuit of an exemplary electrical state of the plasma processing apparatus 10 when an RF power is applied to the stage 2. As illustrated in FIG. 4, the plasma processing apparatus 10 is divided into a power supply 201, a matcher 202, and a processing space 203 when the RF power is applied to the stage 2. The power supply 201 includes, for example, the first RF power supply 10a in FIG. 1. The matcher 202 includes, for example, the first matcher 11a in FIG. 1, and a circuit configuration of the first matcher 11a includes variable capacitors C'1 and C2. The matcher 202 further includes, for example, the measuring device VM in FIG. 1 in addition to the circuit configuration of the first matcher 11a. The measuring device VM measures the voltage Vpp, which is the RF voltage of the RF power output from the first RF power supply 10a and applied to the stage 2 via the first matcher 11a, and notifies the controller 100 of RF voltage data indicating the voltage Vpp. The processing space 203 includes, for example, the inner wall surface of the processing container 1, the stage 2 as the lower electrode, the support table 4, the focus ring 5, the shower head 16 as the upper electrode, and the insulator 95, which are members disposed inside the processing container 1. When the RF power is applied to the stage 2, the inner wall surface of the processing container 1, the stage 2, and the focus ring 5 are considered as, for example, resistors R1, R2, and R5, respectively. The support table 4 and the insulator 95 are considered as, for example, capacitors C4 and C95, respectively. The main body 16a and the upper ceiling plate 16b of the shower head 16 are considered as, for example, resistors R16a and R16b, respectively. A gap between the shower head 16 and the stage 2 is considered as a capacitor $C_{Gap}$. A combined impedance Z of the members within the processing container 1 changes depending on a change in a temperature T of the members within the processing container 1. Then, since Vpp=Z·I is established according to Ohm's law, when an RF current I is constant, the voltage Vpp of the RF power applied to the stage 2 changes depending on a change in the combined impedance Z. In other words, the voltage Vpp changes depending on the change in the temperature T of the members within the processing container 1. Accordingly, it can be seen that even when a thermometer is not provided in the processing container 1, it is possible to determine whether or not the temperature of the members within the processing container 1 is saturated by measuring the voltage Vpp.

When plasma is generated, the RF power output by the first RF power supply 10a is absorbed by the load (plasma) side, and thus reflected waves are not observed or the observed value is small. Moreover, since a magnitude of the reflected waves is determined depending on a change in a load impedance, the magnitude of the reflected waves changes when a state of plasma changes. Like the reflected waves, the voltage Vpp fluctuates depending on the change of the load impedance caused by influence of disturbance. Therefore, at the time of plasma ignition, reliability of the measured value of the voltage Vpp is low. Thus, when the temperature is measured by using the voltage Vpp, the measurement result may be inaccurate.

Meanwhile, when the RF waves radiated from the stage 2 as the lower electrode are totally reflected by the upper ceiling plate 16b of the shower head 16 as the upper electrode, plasma is not generated and the applied power is returned to the stage 2 as reflected waves. When the plasma is not ignited, it is possible to suppress the change in impedance by reducing influence of conditions in the processing container 1, such as a gas flow rate and a pressure, and the RF waves are not absorbed by the load side but are totally reflected. Thus, it is possible to obtain a constant value for the magnitude of the reflected waves. In addition, the voltage Vpp when the RF waves are totally reflected changes depending on the change of the combined impedance Z, which accompanies the change of the temperature T of the members within the processing container 1. Therefore, the plasma processing apparatus 10 measures the voltage Vpp when the RF waves are totally reflected after performing the seasoning process once, and determines whether or not the temperature of the members within the processing container 1 is saturated based on the measured voltage Vpp.

Descriptions will be made referring back to FIG. 2. The seasoning processing part 121 controls the respective components of the plasma processing apparatus 10 to perform the seasoning process. For example, the seasoning processing part 121 reads a recipe or the like corresponding to the seasoning process that is to be performed from the storage 140, and controls the respective components of the plasma processing apparatus 10 based on the read recipe or the like. The seasoning process is implemented by igniting plasma in a state in which a dummy wafer is placed on the stage 2. In the present embodiment, the seasoning processing part 121 repeatedly performs the seasoning process multiple times. As the seasoning process is repeated, the temperature of the members within the processing container 1 gradually increases.

The plasma processing part 122 controls the respective components of the plasma processing apparatus 10 so as to perform a plasma process on the wafer W loaded into the processing container 1. For example, the plasma processing part 122 reads a recipe or the like according to a plasma etching process that is to be performed from the storage 140, and controls the respective components of the plasma processing apparatus 10 based on the read recipe or the like. The plasma processing part 122 performs the plasma process on the wafer W after the repetition of the seasoning process by the seasoning processing part 121 is stopped.

After the seasoning process is performed, the power application part 123 applies an RF power to the stage 2 without igniting plasma. That is, after the seasoning process is performed, the power application part 123 applies an RF power having a level at which total reflection occurs without generating plasma, from the first RF power supply 10a to the stage 2. For example, the power application part 123 applies the RF power to the stage 2 without igniting the plasma each time the seasoning process is completed.

In addition, after performing the plasma process on the wafer W, the power application part 123 applies an RF power to the stage 2 without igniting plasma. That is, after the plasma process is performed on the wafer W, the power application part 123 applies an RF power having a level at which total reflection occurs without generating plasma, from the first RF power supply 10a to the stage 2.

The measuring part 124 measures a physical quantity related to the RF power applied by the power application part 123. Specifically, the measuring part 124 measures the voltage Vpp as the physical quantity related to the RF power by using the voltage Vpp of the RF power indicated by the RF voltage data input to the external interface 110. The measuring part 124 measures the voltage Vpp each time the seasoning process is completed. Examples of a measurement timing for measuring the voltage Vpp may include a timing at which the seasoning process is completed once and the plasma disappears, a timing at which a predetermined time has elapsed after the plasma disappears, and the like. In some embodiments, the measurement timings corresponding to the respective seasoning processes may be the same.

Further, the measuring part 124 measures a physical quantity related to an RF power applied by the power application part 123 after the plasma process is performed on the wafer W. That is, the measuring part 124 measures the voltage Vpp as the physical quantity related to the RF power after the plasma process is performed on the wafer W.

The acquisition part 125 acquires the determination reference information 141 indicating the voltage Vpp measured in advance in a state in which the temperature of the members within the processing container 1 is saturated. For example, the acquisition part 125 reads and acquires the determination reference information 141 from the storage 140. A timing for acquiring the determination reference information 141 can be any timing, but may be, for example, a timing during which the seasoning process has not yet been performed for the first time. In the present embodiment, it has been described that the determination reference information 141 is stored in the storage 140 in advance. However, when the determination reference information 141 is stored in another device, the acquisition part 125 may acquire the determination reference information 141 via a network.

Figure 5:
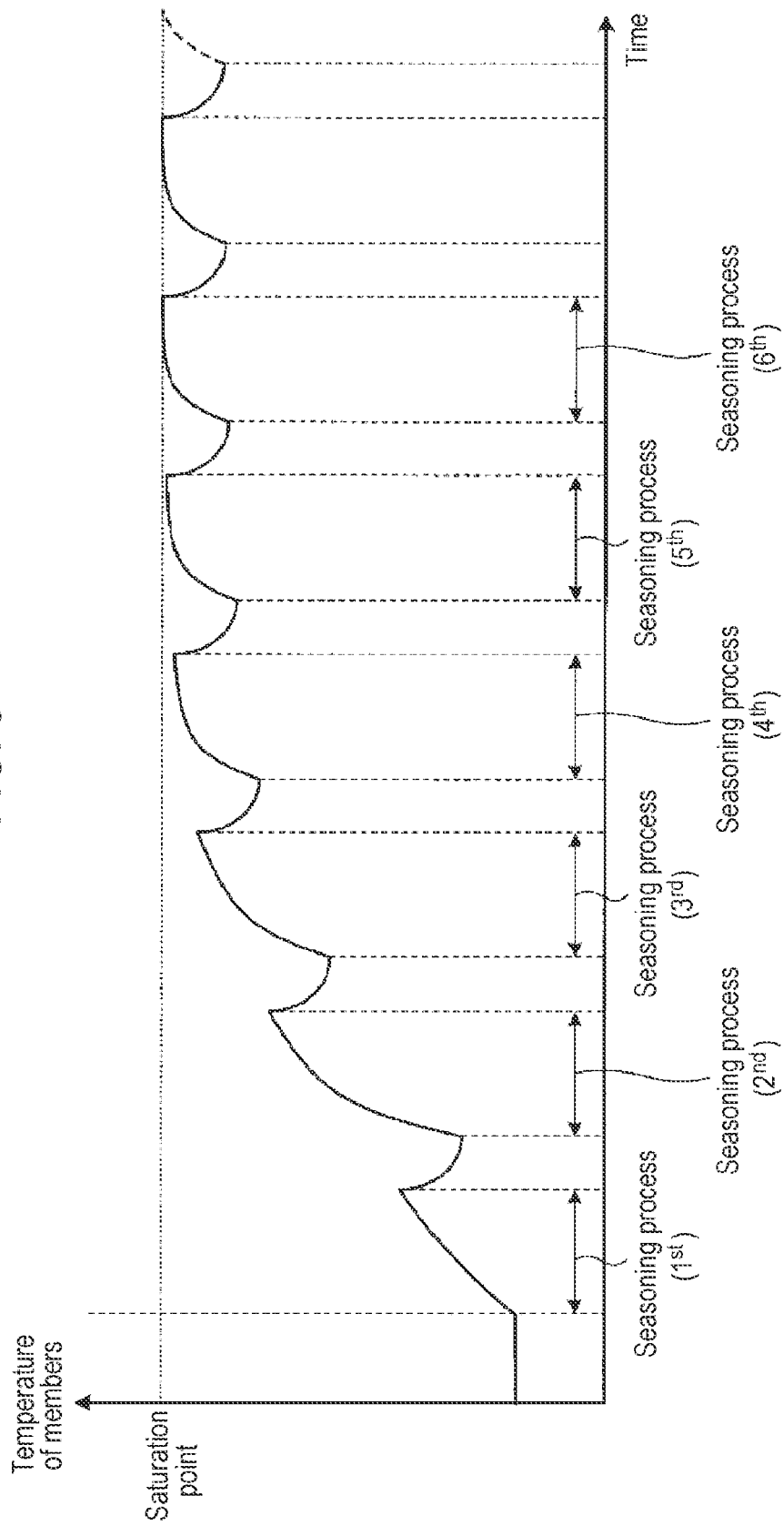
FIG. 5 is a view illustrating an exemplary relationship between a temperature of members within a processing container and a repetition number of a seasoning process.

Here, the determination reference information 141 will be further described with reference to FIG. 5. FIG. 5 is a view illustrating an exemplary relationship between a temperature of members within the processing container 1 and a repetition number of the seasoning process. FIG. 5 shows measurement results of the temperature of the members within the processing container 1 when the seasoning process is repeatedly performed.

As illustrated in FIG. 5, the temperature of the members within the processing container 1 gradually increases with the repetition of the seasoning process, and reaches a certain saturation point. Since an interval period for exchanging dummy wafers is provided between a seasoning process and a subsequent seasoning process, the temperature of the members within the processing container 1 temporarily drops during the interval period.

As described above, in the plasma processing apparatus 10, the temperature of the members within the processing container 1 increases with the repetition of the seasoning process, and finally reaches the certain saturation point. In addition, since the voltage Vpp changes depending on the change in the temperature of the members within the processing container 1, when the temperature of the members within the processing container 1 reaches the certain saturation point, the voltage Vpp also reaches a certain saturation point.

Therefore, through an experiment or the like, the voltage Vpp is measured in the state in which the temperature of the members within the processing container 1 is saturated by repeating the seasoning process. Then, the measured voltage Vpp is stored in advance in the storage 140 as the determination reference information 141. For example, in FIG. 5, the temperature of the members within the processing container 1 after the sixth seasoning process is not changed from the temperature of the members within the processing container 1 after the fifth seasoning process is performed. In this case, since it is considered that the temperature of the members within the processing container 1 is saturated, the voltage Vpp measured after the sixth seasoning process is performed is stored in advance in the storage 140 as the determination reference information 141.

Descriptions will be made referring back to FIG. 2. The determination part 126 determines whether or not the temperature of the members within the processing container 1 is saturated based on the voltage Vpp measured by the measuring part 124. That is, the determination part 126 determines whether or not the temperature of the members within the processing container 1 is saturated by comparing the voltage Vpp measured by the measuring part 124 with the voltage Vpp indicated by the determination reference information 141 acquired by the acquisition part 125 (hereinafter, appropriately referred to as "reference Vpp"). In the present embodiment, the determination part 126 determines whether or not the temperature of the members within the processing container 1 is saturated by determining whether or not the voltage Vpp measured by the measuring part 124 falls within a permissible range of the reference Vpp. The permissible range of the reference Vpp is a range from a permissible value lower than the reference Vpp (a lower limit) to a permissible value higher than the reference Vpp (an upper limit) with respect to the reference Vpp.

When the determination part 126 determines that the temperature of the members within the processing container 1 is not saturated, the determination part 126 causes the seasoning processing part 121 to continue the repetition of the seasoning process. On the other hand, when the determination part 126 determines that the temperature of the members within the processing container 1 is saturated, the determination part 126 causes the seasoning processing part 121 to stop the repetition of the seasoning process.

Therefore, in the plasma processing apparatus 10, it is possible to determine the saturation of the temperature of the members within the processing container 1 with high precision without providing a thermometer within the processing container 1. As a result, it is possible to suppress excessive repetition of the seasoning process.

In addition, after determining that the temperature of the members within the processing container 1 is saturated, in order to improve reproducibility of the state in which the temperature of the members within the processing container 1 is saturated when the plasma process is performed on the wafer W, the seasoning process may be additionally repeated a predetermined number of times before stopping the repetition of the seasoning process.

In addition, when the determination part 126 determines that the temperature of the members within the processing container 1 is not saturated because the temperature of the members within the processing container 1 is lower than the permissible temperature range, that is, the temperature is lower than the lower limit of the permissible range of the reference Vpp, the determination part 126 may determine whether or not the seasoning process has been repeated a predetermined number of times. Then, when the determination part 126 determines that the temperature of the members within the processing container 1 is not saturated and the seasoning process has not been repeated the predetermined number of times, the determination part 126 may cause the repetition of the seasoning process to continue. On the other hand, when the determination part 126 determines that the temperature of the members within the processing container 1 is not saturated but the seasoning process has been repeated the predetermined number of times, the determination part 126 may provide an alert notification. Further, the determination part 126 may provide an alert notification when the temperature of the members within the processing container 1 is higher than the permissible temperature range, that is, higher than the upper limit of the permissible range of the reference Vpp. Such an alert may be of any type, as long as the alert can notify a manager of the plasma processing apparatus 10 that the seasoning process is not normally performed due to a failure of hardware or the like. For example, the determination part 126 may output a message notifying the user interface 130 of an abnormality in the seasoning process.

As described above, the plasma processing apparatus 10 may appropriately provide a notification of an abnormality in the seasoning process.

In addition, the determination part 126 determines whether or not the temperature saturation of the members within the processing container 1 is maintained based on the voltage Vpp measured by the measuring part 124 after the plasma process is performed on the wafer W. That it, the determination part 126 determines whether or not the temperature saturation of the members within the processing container 1 is maintained by comparing the voltage Vpp measured by the measuring part 124 after the plasma process is performed on the wafer W with the reference Vpp. In the present embodiment, the determination part 126 determines whether or not the temperature saturation of the members within the processing container 1 is maintained by determining whether or not the voltage Vpp measured by the measuring part 124 after the plasma process is performed on the wafer W falls within the permissible range of the reference Vpp.

Then, the determination part 126 provides an alert notification when it is determined that the temperature saturation of the members within the processing container 1 is not maintained. Such an alert may be of any type, as long as the alert indicates that the plasma process is performed in the state in which the temperature of the members within the processing container 1 is higher or lower than the permissible temperature range due to a failure of hardware or the like, and can notify the manager of the plasma processing apparatus 10 that the plasma process is not normally performed. For example, the determination part 126 may output a message notifying the user interface 130 of an abnormality in the plasma process.

As described above, it is possible for the plasma processing apparatus 10 to appropriately provide a notification of an abnormality in the plasma process.

[Process Flow]

Figure 6:
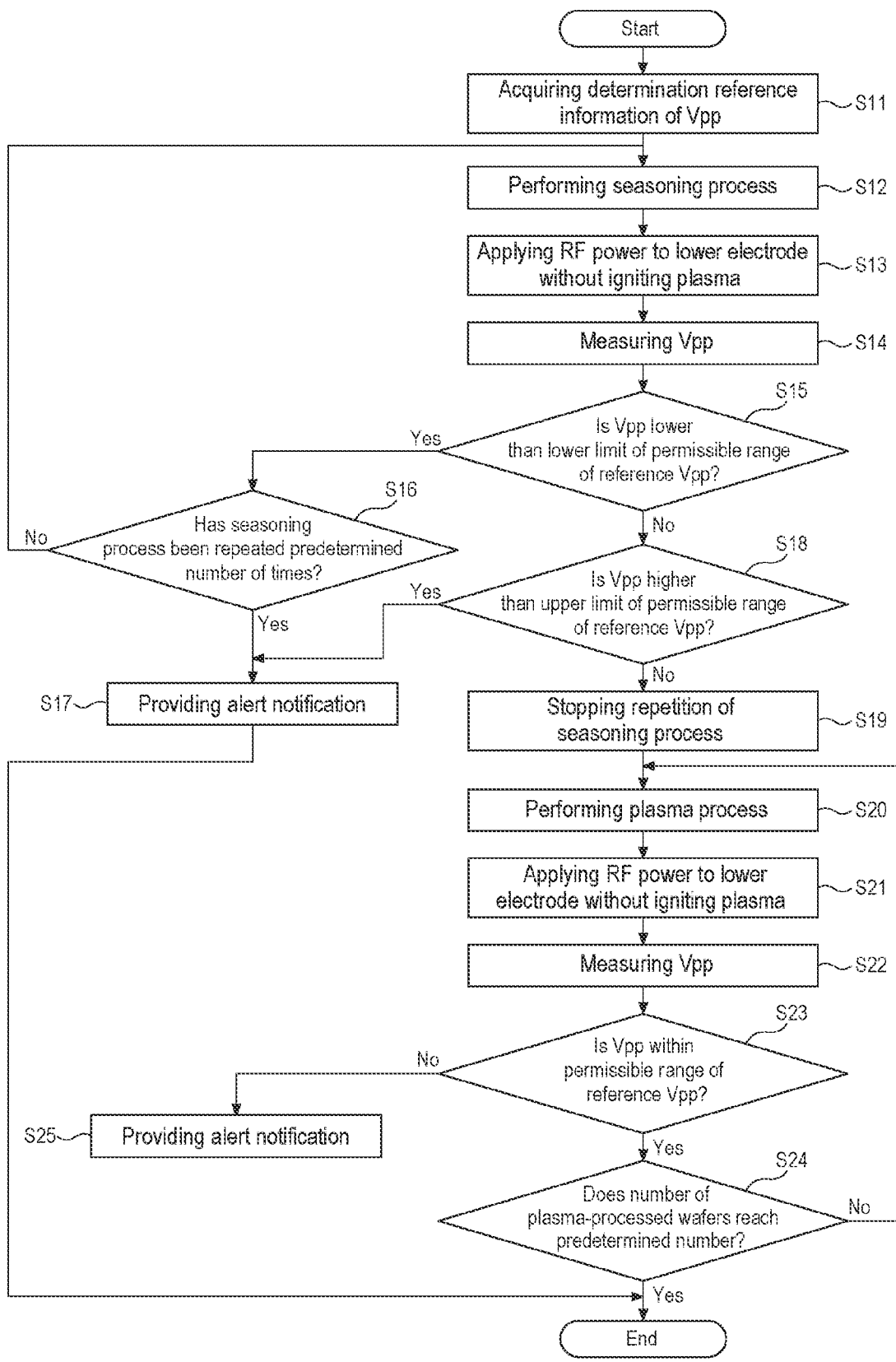
FIG. 6 is a flowchart illustrating an exemplary flow of a plasma processing method according to an embodiment.

Next, descriptions will be made on a flow of a plasma processing method which includes a member-temperature determination process of determining whether or not the temperature of members within the processing container 1 is saturated, and in which the plasma processing apparatus 10 starts a plasma processing on the wafer W depending on the determination result of the member-temperature determination process. FIG. 6 is a flowchart illustrating an exemplary flow of a plasma processing method according to an embodiment.

The acquisition part 125 acquires the determination reference information 141 indicating the voltage Vpp measured in advance in the state in which the temperature of members within the processing container 1 is saturated (step S11). For example, the acquisition part 125 acquires the determination reference information 141 at a timing during which the seasoning process has not yet been performed for the first time.

The seasoning processing part 121 performs the seasoning process by, for example, igniting plasma in the state in which a dummy wafer is placed on the stage 2 (step S12). After the seasoning process is performed, the dummy wafer is replaced in the state in which the plasma has disappeared.

After the seasoning process is performed, the power application part 123 applies an RF power to the stage 2 without igniting plasma (step S13). At this time, the power application part 123 applies the RF power in the state in which the dummy wafer is placed on the stage 2. By applying the RF power in the state in which the dummy wafer is placed on the stage 2, it is possible to protect the stage 2 from plasma when the plasma is inadvertently ignited.

The measuring part 124 measures the voltage Vpp as a physical quantity related to the applied RF power (step S14).

The determination part 126 determines whether or not the temperature of the members within the processing container 1 is saturated by determining whether or not the measured voltage Vpp falls within a permissible range of the reference Vpp indicated by the determination reference information 141 (step S15).

When it is determined that the temperature of the members within the processing container 1 is not saturated because the measured voltage Vpp is lower than the lower limit of the permissible range of the reference Vpp (step S15: "Yes"), the determination part 126 determines whether or not the seasoning process has been repeated a predetermined number of times (step S16). When it is determined that the seasoning process has not been repeated the predetermined number of times (step S16: "No"), the determination part 126 returns the processing to step S12 to continue the repetition of the seasoning process.

On the other hand, when it is determined that the seasoning process has been repeated the predetermined number of times (step S16: "Yes"), the seasoning process is not normally performed, and thus the determination part 126 provides an alert notification (step S17), and terminates the processing.

In addition, when it is determined that the measured voltage Vpp is higher than the upper limit of the permissible range of the reference Vpp and the temperature of the members within the processing container 1 is higher than the permissible temperature range (step S15: "No", step S18: "Yes"), the seasoning process is not normally performed, and thus the determination part 126 provides an alert notification (step S17) and terminates the processing.

On the other hand, when it is determined that the measured voltage Vpp falls within the permissible range of the reference Vpp and the temperature of the members within the processing container 1 is saturated (step S15: "No", step S18: "No"), the determination part 126 stops the repetition of the seasoning process (step S19). Thereafter, in order to improve the reproducibility of the state in which the temperature of the members within the processing container 1 is saturated when the plasma process is performed on the wafer W in step S20, the seasoning process may be additionally repeated a predetermined number of times before stopping the repetition of the seasoning process.

The plasma processing part 122 performs the plasma process on the wafer W after the repetition of the seasoning process is stopped (step S20). After the plasma process is performed, exchange of the wafer W is carried out in the state in which the plasma has disappeared.

After the plasma process is performed on the wafer W, the power application part 123 applies an RF power to the stage 2 without igniting plasma (step S21). At this time, the power application part 123 applies the RF power in the state in which the wafer W is placed on the stage 2. By applying the RF power in the state in which the wafer W is placed on the stage 2, it is possible to protect the stage 2 from plasma when the plasma is inadvertently ignited.

The measuring part 124 measures the voltage Vpp as a physical quantity related to the applied RF power (step S22).

The determination part 126 determines whether or not the temperature saturation of the members within the processing container 1 is maintained by determining whether or not the measured voltage Vpp falls within the permissible range of the reference Vpp indicated by the determination reference information 141 (step S23). When it is determined that the measured voltage Vpp falls within the permissible range of the reference Vpp and the temperature saturation of the members within the processing container 1 is maintained (step S23: "Yes"), the determination part 126 determines whether or not the number of plasma-processed wafers W has reached a predetermined number (step S24). When it is determined that the number of plasma-processed wafers W has not reached the predetermined number (step S24: "No"), the determination part 126 returns the processing to step S20 to continue the repetition of the plasma process.

On the other hand, when it is determined that the number of plasma-processed wafers W has reached the predetermined number (step S24: "Yes"), the determination part 126 terminates the processing.

On the other hand, when the measured voltage Vpp has not reached the permissible range of the reference Vpp and the temperature saturation of the members within the processing container 1 is not maintained (step S23: "No"), the plasma process is not normally performed, and thus the determination part 126 performs the following processing. That is, the determination part 126 provides an alert notification (step S25) and terminates the processing.

Figure 7:
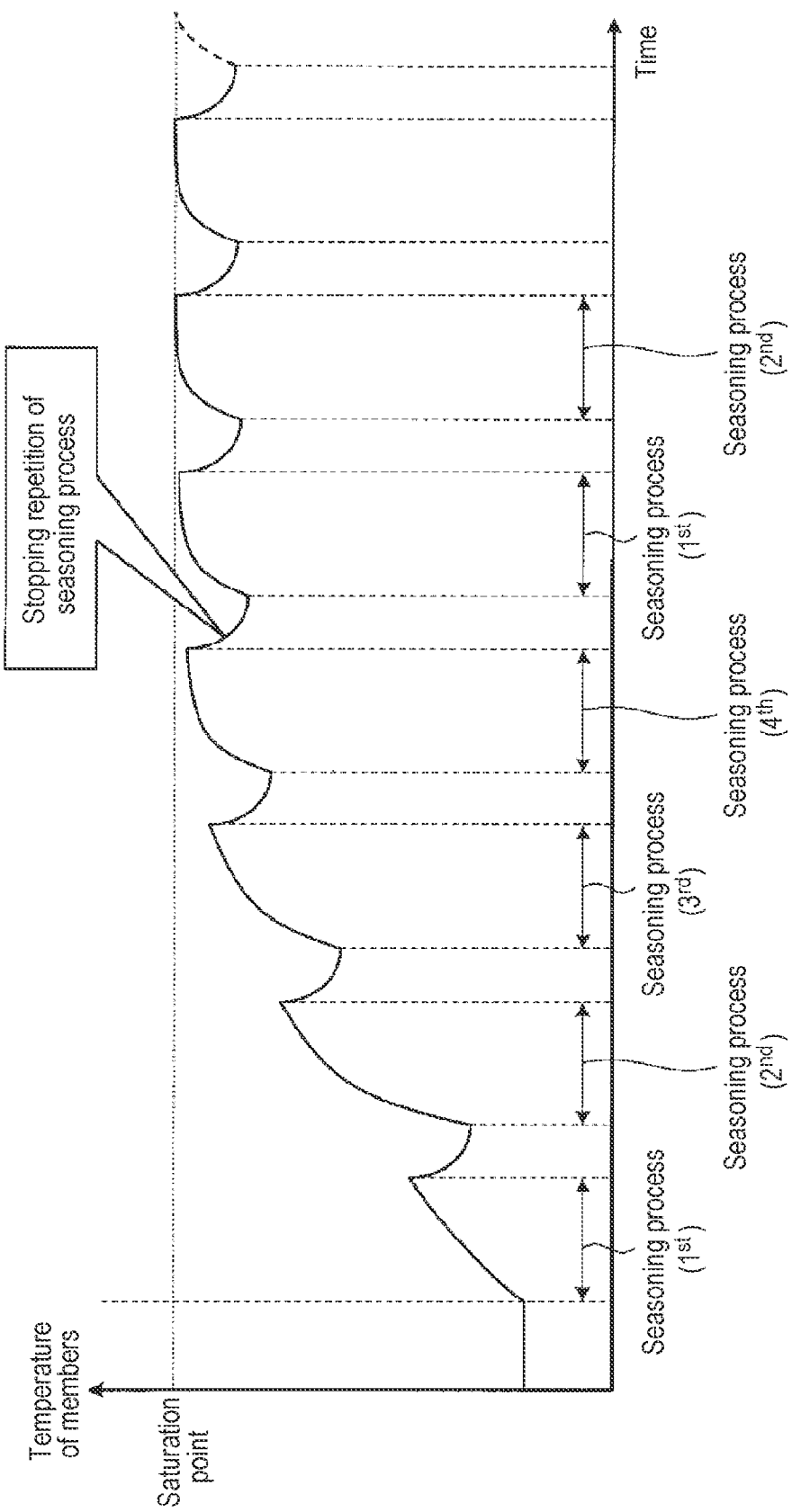
FIG. 7 is a view illustrating a specific example of a flow in which a plasma processing is started after a temperature of members within a processing container is saturated.

Next, a specific example will be described. FIG. 7 is a view illustrating a specific example of a flow in which a plasma process is started after a temperature of members within the processing container 1 is saturated.

For example, as illustrated in FIG. 7, it is assumed that the temperature of the members within the processing container 1 gradually increases with the repetition of the seasoning process, and that the temperature of the members within the processing container 1 reaches a temperature near a certain saturation point after the fourth seasoning process is performed. In addition, since the voltage Vpp changes depending on the change in the temperature of the members within the processing container 1, it is assumed that the voltage Vpp also reaches a value near the reference Vpp after the fourth seasoning process is performed. In this case, since the voltage Vpp falls within the permissible range of the reference Vpp, the plasma processing apparatus 10 determines that the temperature of the members within the processing container 1 is saturated, and stops the repetition of the seasoning process. Thus, it possible to suppress excessive repetition of the seasoning process so that a delay in the timing of starting the plasma process for the first time can be reduced. As a result, it is possible to improve the operation rate (throughput) of the plasma processing apparatus 10.

As described above, the plasma processing apparatus 10 according to the present embodiment is a plasma processing apparatus that includes the processing container 1 and the stage 2, and further includes the seasoning processing part 121, the power application part 123, the measuring part 124, and the determination part 126. The seasoning processing part 121 performs a seasoning process of igniting plasma to increase a temperature of members within the processing container 1. After the seasoning process is performed, the power application part 123 applies an RF power to the stage 2 without igniting plasma. The measuring part 124 measures a physical quantity related to the RF power applied by the power application part 123. The determination part 126 determines whether or not the temperature of the members within the processing container 1 is saturated based on the physical quantity related to the RF power measured by the measuring part 124. Thus, it is possible for the plasma processing apparatus 10 to determine whether or not the temperature of the members within the processing container 1 is saturated with high precision without providing a thermometer in the processing container 1.

In addition, the plasma processing apparatus 10 according to the present embodiment includes the acquisition part 125 configured to acquire the determination reference information 141 indicating a physical quantity related to an RF power, which is measured in advance in a state in which the temperature of the members within the processing container 1 is saturated. The determination part 126 determines whether or not the temperature of the members within the processing container 1 is saturated by comparing the physical quantity related to the RF power measured by the measuring part 124 with the physical quantity related to the RF power and indicated by the determination reference information 131 acquired by the acquisition part 125. Thus, it is possible for the plasma processing apparatus to determine whether or not the temperature of the members within the processing container 1 is saturated with high precision by using the physical quantity related to the RF power and measured in advance in the state in which the temperature of the members within the processing container 1 is saturated.

The seasoning processing part 121 repeatedly performs the seasoning process a plurality of times. The power application part 123 applies an RF power to the stage 2 without igniting plasma each time the seasoning process is completed. The measuring part 124 measures a physical quantity related to the RF power each time the seasoning process is completed. When the determination part 126 determines that the temperature of the members within the processing container 1 is not saturated, the determination part 126 causes the seasoning processing part 121 to continue the repetition of the seasoning process. On the other hand, when the determination part 126 determines that the temperature of the members within the processing container 1 is saturated, the determination part 126 causes the seasoning processing part 121 to stop the repetition of the seasoning process. Thus, it is possible for the plasma processing apparatus 10 to suppress excessive repetition of the seasoning process. As a result, it is possible to improve the operation rate (throughput) of the plasma processing apparatus 10.

In addition, the plasma processing apparatus 10 according to the present embodiment includes the plasma processing part 122 configured to perform a plasma process on the wafer W loaded into the processing container 1. The power application part 123 applies an RF power to the stage 2 after the plasma process is performed. The measuring part 124 measures a physical quantity related to the RF power applied by the power application part 123 after the plasma process is performed. The determination part 126 determines whether or not the temperature saturation of the members within the processing container 1 is maintained based on the physical quantity related to the RF power measured by the measuring part 124 after the plasma process is performed. Thus, it is possible for the plasma processing apparatus 10 to determine whether or not the temperature saturation of the members within the processing container 1 is maintained with high precision when the plasma process is performed on the wafer W after the repetition of the seasoning process is stopped.

In addition, the determination part 126 provides an alert notification when it is determined that the temperature saturation of the members within the processing container 1 is not maintained. Thus, it is possible for the plasma processing apparatus 10 to appropriately provide a notification of an abnormality in the plasma process.

It shall be understood that the embodiments disclosed herein are illustrative and are not restrictive in all aspects. The above-described embodiments may be omitted, replaced, or modified in various forms without departing from the scope and spirit of the appended claims.

For example, in the above-described embodiments, the first RF power supply 10a is connected to the base 2a via the first matcher 11a, but may be connected to the shower head 16 serving as an upper electrode via the first matcher 11a. Even in this case, since it is possible to illustrate the plasma processing apparatus 10 by an equivalent circuit as illustrated in FIG. 4, it is possible to measure the voltage Vpp of the RF power applied to the shower head 16.

In the above-described embodiments, the measuring device VM measures and outputs the voltage Vpp (i.e., an RF voltage) of the RF power applied to the stage 2, but may measure and output an RF current or a phase difference between the RF voltage and the RF power. The measuring device VM may output an impedance obtained by dividing the measured RF voltage by the RF current. In addition, the measuring device VM may output an RF power at a measuring point, which is a product of the measured RF voltage and the RF current. In addition, the measuring device VM may output an amount of change in the RF voltage from an initial state in which the seasoning process has not yet been performed. In addition, the measuring device VM may output an amount of change in the RF current from the initial state in which the seasoning process has not yet been performed. In addition, the measuring device VM may output an amount of change in the phase difference between the RF voltage and the RF power from the initial state in which the seasoning process has not yet been performed. In addition, the measuring device VM may output an amount of change in the impedance from the initial state in which the seasoning process has not yet been performed. These values output from the measuring device VM are examples of physical quantities related to the RF power applied to the stage 2.

According to the present disclosure, it is possible to determine whether or not a temperature of members within a processing container is saturated with high precision.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A plasma processing apparatus comprising:
a processing container;
an electrode provided in the processing container;
a radio frequency (RF) power supply configured to apply RF power to the electrode via a matcher provided outside the processing container;
a measurement device provided in the matcher and configured to measure a physical quantity related to the RF power applied to the electrode by the RF power supply; and
a controller programmed to execute instructions in its memory;
to perform for a predetermined time a preprocessing of igniting plasma in the processing container to increase a temperature of members within the processing container;
to apply, RF power to the electrode without igniting plasma in the processing container after the preprocessing;
to measure, the physical quantity related to the RF power applied by the RF power supply;
to determine whether or not the temperature of the members within the processing container is saturated based on the physical quantity related to the RF power measured by the measurement device; and to
repeat above instructions if needed to bring the temperature of the members within the processing container to saturation.

2. The plasma processing apparatus of claim 1,
wherein the controller is further programmed to execute instructions in its memory for:
acquiring determination reference information indicating the physical quantity related to the RF power and measured in advance in a state in which the temperature of the members within the processing container is saturated; and
determining whether or not the temperature of the members within the processing container is saturated by comparing the physical quantity related to the RF power measured by the measurement device with the acquired determination reference information.

3. The plasma processing apparatus of claim 2, wherein the controller is further programmed to execute instructions in its memory for:
repeating the preprocessing a plurality of times;
applying, by the RF power supply, the RF power to the electrode without igniting plasma in the processing container each time the preprocessing is completed;
measuring, by the measurement device, the physical quantity related to the RF power each time the preprocessing is completed; and
continuing repetition of the preprocessing when the temperature of the members within the processing container is determined not to be saturated, and stopping the repetition of the preprocessing when the temperature of the members within the processing container is determined to be saturated.

4. The plasma processing apparatus of claim 3,
wherein the controller is further programmed to execute instructions in its memory for:
performing a plasma process on a workpiece loaded into the processing container after the repetition of the preprocessing is stopped;
after the plasma process is performed, applying, by the RF power supply, RF power to the electrode without igniting plasma in the processing container;
after the plasma process is performed, measuring, by the measurement device, the physical quantity related to the RF power applied by the RF power supply; and after the plasma process is performed, determining whether or not the temperature saturation of the members within the processing container is maintained based on the physical quantity related to the RF power measured by the measurement device.

5. The plasma processing apparatus of claim 4, wherein the controller is further programmed to execute instructions in its memory for providing an alert notification when the temperature saturation of the members within the processing container is determined not to be maintained.

6. The plasma processing apparatus of claim 5, wherein the measurement device is a voltmeter, and the physical quantity related to the RF power is an RF voltage of the RF power.

7. The plasma processing apparatus of claim 1, wherein the controller is further programmed to execute instructions in its memory for:

repeating the preprocessing a plurality of times;

applying, by the RF power supply, the RF power to the electrode without igniting plasma in the processing container each time the preprocessing is completed;

measuring, by the measurement device, the physical quantity related to the RF power each time the preprocessing is completed; and continuing repetition of the preprocessing when the temperature of the members within the processing container is determined not to be saturated, and stopping the repetition of the preprocessing when the temperature of the members within the processing container is determined to be saturated.

8. A method of determining a temperature of members in a plasma processing apparatus, wherein the plasma processing apparatus comprises:

a processing container;

an electrode provided in the processing container;

a radio frequency (RF) power supply configured to apply RF power to the electrode via a matcher provided outside the processing container; and a measurement device provided in the matcher and configured to measure a physical quantity related to the RF power applied to the electrode by the RF power supply, and wherein the method comprises:

performing a preprocessing of igniting plasma in the processing container to increase the temperature of the members within the processing container;

after the preprocessing is performed, applying, by the RF power supply, RF power to the electrode without igniting plasma in the processing container and measuring, by the measurement device, the physical quantity related to the applied RF power; and determining whether or not the temperature of the members within the processing container is saturated based on the measured physical quantity related to the RF power;

continuing repetition of the preprocessing when the temperature of the members within the processing container is determined not to be saturated, and stopping the repetition of the preprocessing when the temperature of the members within the processing container is determined to be saturated.

* * * * *